United States Patent
Wong et al.

(10) Patent No.: US 8,933,751 B1
(45) Date of Patent: Jan. 13, 2015

(54) HIGH RESOLUTION CAPACITOR

(75) Inventors: Wilson Wong, San Francisco, CA (US); Weiqi Ding, Fremont, CA (US); Shuxian Chen, Fremont, CA (US); Simardeep Maangat, San Jose, CA (US); Albert Ratnakumar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 9 days.

(21) Appl. No.: 13/475,678

(22) Filed: May 18, 2012

(51) Int. Cl.
*H03F 3/45* (2006.01)
*H01G 4/40* (2006.01)
*H03F 1/56* (2006.01)

(52) U.S. Cl.
CPC ... *H01G 4/40* (2013.01); *H03F 1/56* (2013.01)
USPC ............................................. 330/69; 330/86

(58) Field of Classification Search
CPC ......... H03F 3/45475; H03F 3/72; H03F 1/36; H03F 1/083; H03F 3/45071; H03G 1/008; H03G 1/0088; H03H 11/1217
USPC .............. 330/69, 86, 107, 109, 260, 282, 294
See application file for complete search history.

(56) References Cited

U.S. PATENT DOCUMENTS

| | | | |
|---|---|---|---|
| 7,102,438 B1 * | 9/2006 | Colleran et al. | 330/69 |
| 7,368,987 B2 * | 5/2008 | Blon | 330/260 |
| 7,423,479 B2 * | 9/2008 | Higuchi | 330/9 |
| 7,696,819 B2 * | 4/2010 | Cho et al. | 330/86 |

* cited by examiner

*Primary Examiner* — Khanh V Nguyen
(74) *Attorney, Agent, or Firm* — Ward & Zinna, LLC

(57) ABSTRACT

A first trimming capacitor having a first terminal and a second terminal is coupled in parallel between a first terminal and a second terminal of a first capacitor. The first trimming capacitor comprises a first plurality of switched capacitors having different capacitances coupled in parallel. Each of the switched capacitors comprises a switch capacitor and a switch coupled in series. In an illustrative application the first capacitor and the first trimming capacitor are coupled between an output terminal of an operational amplifier (op-amp) and an inverting input terminal of the op-amp. A second capacitor and a second trimming capacitor similar to the first capacitor and the first trimming capacitor are coupled between an input and the inverting input terminal of the op-amp.

20 Claims, 3 Drawing Sheets

HIGH RESOLUTION CAPACITOR

BACKGROUND

High accuracy analog circuits often require very accurate capacitors. Examples of such requirements are found in switched capacitor circuits used in filters and analog-to-digital converters (ADC). For example, to achieve resolutions such as 14-bit resolution in an ADC, a circuit would require matching of $(\frac{1}{2}^{14})*100\%=0.006\%$ between two capacitors. The inventors are not aware of such designs in the prior art.

SUMMARY

The present invention is a high resolution capacitor. In an illustrative embodiment, two such capacitors can be matched to within 0.006%.

In an illustrative embodiment, a first trimming capacitor having a first terminal and a second terminal is coupled in parallel between a first terminal and a second terminal of a first capacitor. The first trimming capacitor comprises a first plurality of switched capacitors having different capacitances coupled in parallel between the first and second terminals of the first trimming capacitor. Each of the switched capacitors comprises a switch capacitor and a switch coupled in series with the switch capacitor coupled to the first terminal and the switch coupled to the second terminal.

In an illustrative application, the first capacitor and the first trimming capacitor are coupled between an output terminal of an operational amplifier (op-amp) and an inverting input terminal of the op-amp with the first terminal of the capacitors being coupled to the output terminal of the op-amp and the second terminal being coupled to the inverting input terminal. A second capacitor and a second trimming capacitor similar to the first capacitor and the first trimming capacitor are coupled between an input and the inverting input terminal with the second terminal of the second capacitors being coupled to the inverting input terminal.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
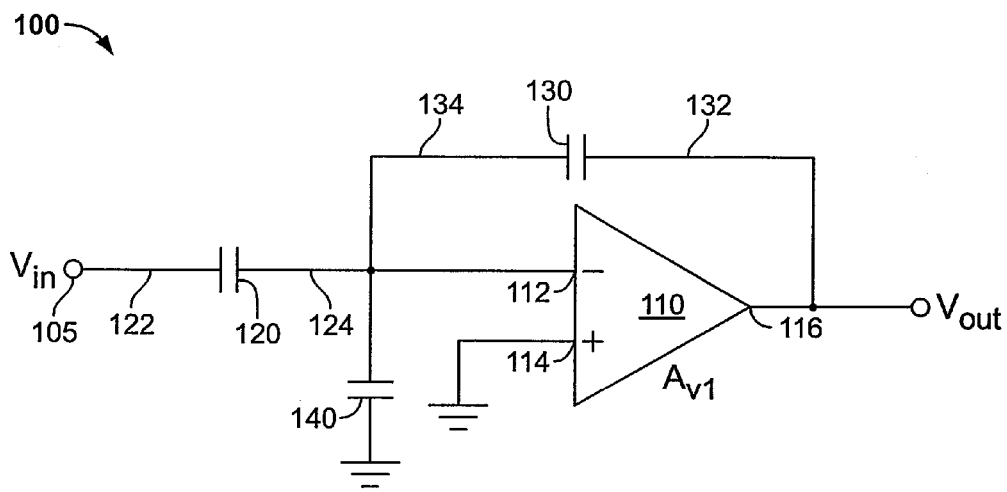
FIG. 1 is a schematic diagram of a conventional op-amp circuit.

FIG. 1 is a schematic diagram of a conventional op-amp circuit 100 in which the invention may be practiced. Circuit 100 comprises an op-amp 110 having an inverting input terminal 112, a non-inverting input terminal 114 and an output terminal 116. A first capacitor 120 is coupled between an input 105 and inverting input terminal 112 with a first terminal 122 coupled to input 105 and a second terminal 124 coupled to the inverting input terminal 112. A second capacitor 130 is coupled between output terminal 116 and inverting input terminal 112 with a first terminal 132 coupled to output terminal 116 and a second terminal 134 coupled to inverting input terminal 112. Parasitic capacitance between the inverting input terminal 112 and ground is represented by capacitor 140. The non-inverting input terminal 114 is AC grounded. As will be recognized by those skilled in the art, inverting input terminal 112 is at virtual ground.

The ideal gain of the circuit of FIG. 1 is:

$$Vout/Vin=C1/C2 \qquad (1)$$

where C1 is the capacitance of capacitor 120 and C2 is the capacitance of capacitor 130. Equation (1) neglects the open loop gain Av1 of the op-amp and the parasitic capacitance Cin of capacitor 140. Accounting for these matters, the gain of the circuit of FIG. 1 is:

$$Vout/Vin=C1/(C2+(C2+C1+Cin)/Av1) \qquad (2)$$

where the values are as defined above.

Figure 2:
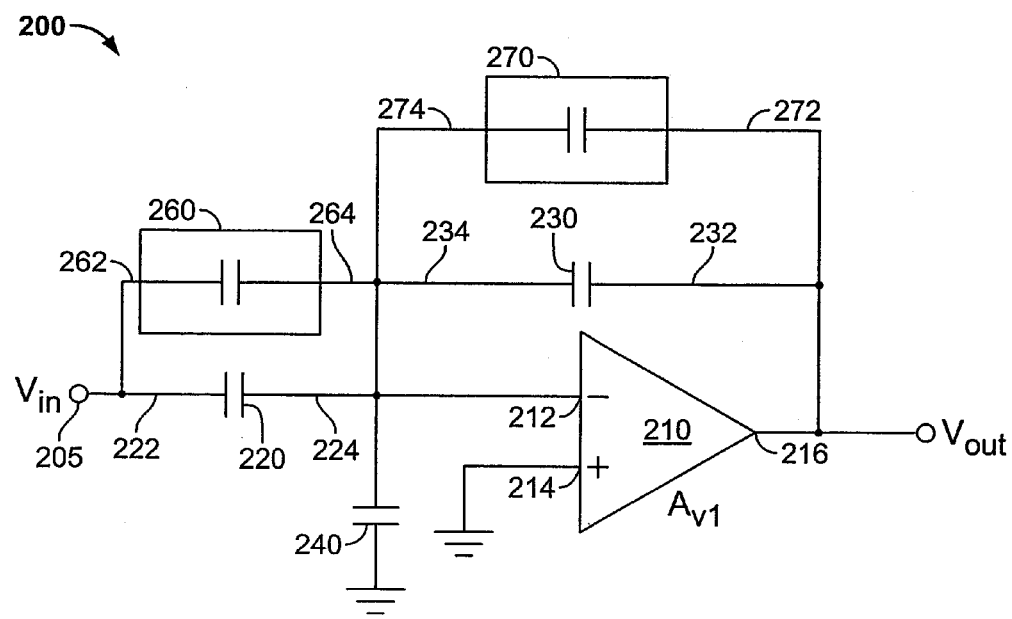
FIG. 2 is a schematic diagram of an illustrative embodiment of the invention.

FIG. 2 is a schematic diagram of an illustrative embodiment of the invention in an op-amp circuit 200. Circuit 200 comprises an op-amp 210 having an inverting input terminal 212, a non-inverting input terminal 214 and an output terminal 216. A first capacitor 220 is coupled between an input 205 and inverting input terminal 212 with a first terminal 222 coupled to the input and a second terminal 224 coupled to the inverting input terminal 212. A second capacitor 230 is coupled between output terminal 216 and inverting input terminal 212 with a first terminal 232 coupled to output terminal 216 and a second terminal 234 coupled to inverting input terminal 212. Parasitic capacitance between the inverting input terminal 212 and ground is represented by capacitor 240. The non-inverting input terminal 214 is AC grounded. These elements are the same as the corresponding elements of FIG. 1 and bear the same numbers increased by 100.

In addition, a first trimming capacitor 260 is coupled in parallel to capacitor 220 and a second trimming capacitor 270 is coupled in parallel to second capacitor 230. The first trimming capacitor has first and second terminals 262, 264 with the first terminal 262 being coupled to input 205 and the second terminal 264 being coupled to the inverting input terminal 212. The second trimming capacitor 270 has first and second terminals 272, 274 with the first terminal 272 being coupled to the output terminal 216 and the second terminal 274 being coupled to the inverting input terminal 212.

Figure 3:
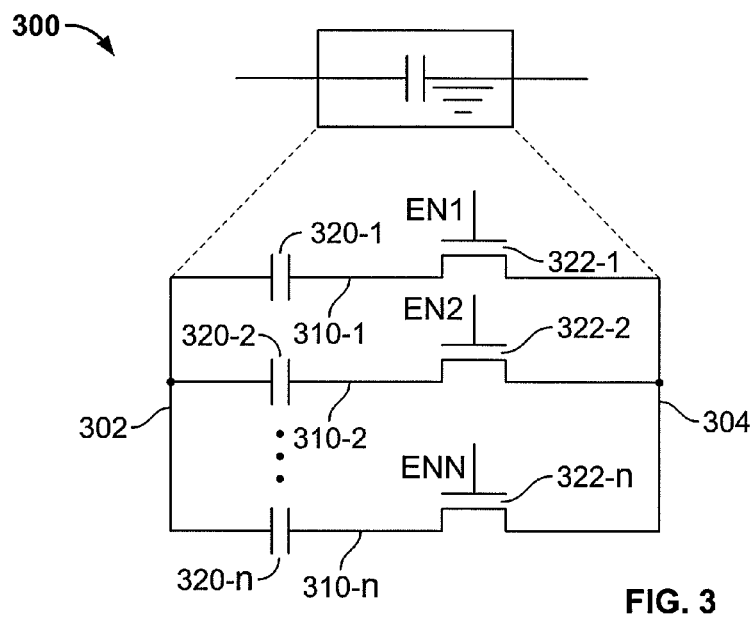
FIG. 3 is a schematic diagram of an illustrative embodiment of a trimming capacitor of the invention.

Each trimming capacitor 260, 270 comprises a plurality of switched capacitors having different capacitances that are coupled in parallel between the first and second terminals of the trimming capacitor. One such trimming capacitor is illustrated in FIG. 3 as capacitor 300. Trimming capacitor 300 comprises a plurality of switched capacitors 310-1, 310-2, 310-*n* having different capacitances that are coupled in parallel between the first and second terminals 302, 304 of the trimming capacitor. Further each switched capacitor comprises a switch capacitor 320-1, 320-2, 320-*n* and a switch 322-1, 322-2, 322-*n* connected in series with the capacitor coupled to the first terminal 302 and the switch coupled to the second terminal 304.

Illustratively, there are six switch capacitors 320-1 to 320-6 and six switches 322-1 to 322-6 in each trimming capacitor 260, 270; and the capacitance of switch capacitors 320-1 to 320-6 are 0.03, 0.06, 0.12, 0.24, 0.48 and 0.96 femtoFarads (ff), respectively. By selective operation of switches 322-1 to 322-6, the capacitance of one of the trimming capacitors can be varied in 0.03 ff increments from 0.00 ff if no switches are conducting up to 1.89 ff if all switches are conducting.

Advantageously, each trimming capacitor 260, 270 is independently controlled so as to achieve any trimming capacitance value in the range from 0.00 ff to 1.89 ff. Thus, the difference between the capacitances generated by the two trimming capacitors can range from +1.89 ff to −1.89 ff. Since the trim structures are identical, any parasitic generated by these structures should cancel out.

Trimming capacitors with other numbers of switched capacitors can also be used in the practice of the invention. To provide a linear distribution of trimming capacitance values over the entire range of trimming capacitance values, each of the switched capacitors should have a different capacitance and the capacitances of the different circuits should differ by a factor of two. Thus, if the first switched capacitor has a capacitance of C, the second switched capacitor should have a capacitance that is approximately C×2, a third switched capacitor should have a capacitance that is approximately $C \times 2^2$, and so on, with a Nth switched capacitor having a capacitance that is approximately $C \times 2^{(N-1)}$.

Figure 4:
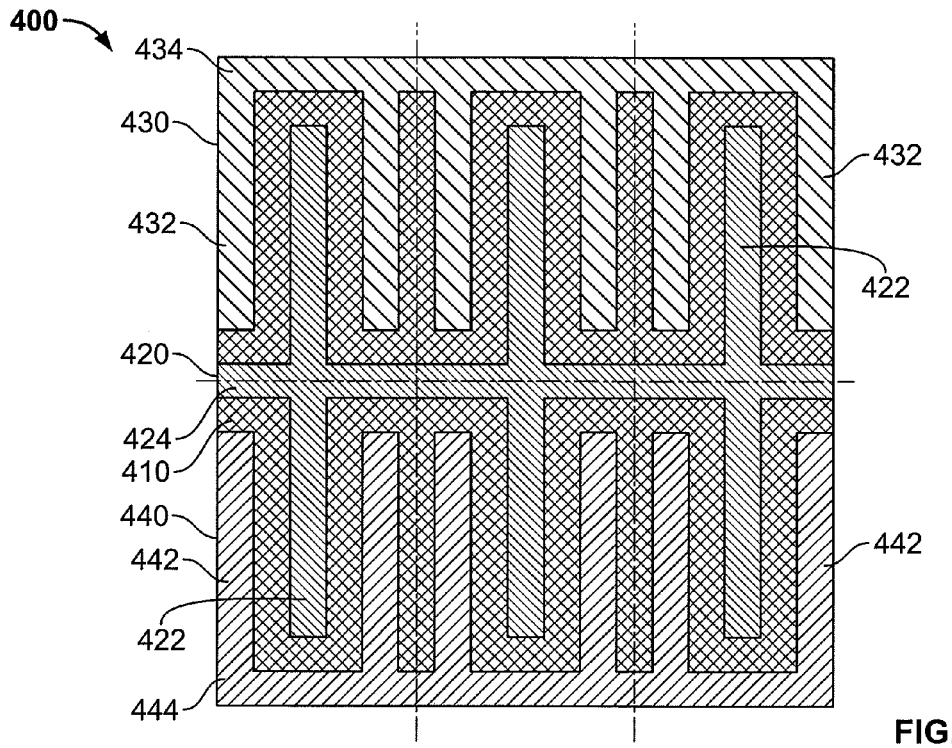
FIG. 4 is a layout of an illustrative embodiment of a trimming capacitor.

FIG. 4 depicts a structure 400 suitable for implementing a switch capacitor. Structure 400 comprises a flat insulating substrate 410 on which are formed first, second and third non-overlapping conducting layers 420, 430 and 440. Advantageously, structure 400 may be formed by depositing a continuous, substantially planar, conducting layer such as a layer of a metal such as aluminum or copper on substrate 410 and then using conventional photolithographic processes to define the patterns of the conducting layers depicted in FIG. 4.

As will be apparent, layers 420, 430 and 440 are inter-digitated with finger regions 422 extending from a base region 424 of layer 420 between finger regions 432 and 442 that extend from base regions 434 and 444 of layers 430 and 440. Illustratively, layer 420 forms one plate of the capacitor and layers 430 and 440 form a second plate of the capacitor. If desired, the spacing between adjacent finger regions of different plates of the capacitor can be at the minimum dimension allowed for the technology used to form the metal layers on substrate 410. Similarly, the width of the finger regions can be limited to approximately the minimum width achievable with the technology used to form the layers. At the time of filing this application, such minimum widths were on the order of 20 to 30 nanometers (nm).

As shown by the dashed horizontal and vertical lines in FIG. 4, capacitor structure 400 is made of six substantially identical cells. When the spacing between the finger regions is approximately 20 nm, the capacitance of a single cell can be approximately 0.03 femtoFarads. All six cells may be coupled together to form a single capacitor having a capacitance of approximately six times the capacitance of a single cell by electrically connecting layers 430 and 440. Capacitors with smaller capacitances can be formed by coupling together fewer than six cells. Capacitors with larger capacitances can be formed using more cells.

As a result, available technology makes it possible to form a capacitor having a configuration such as that depicted in FIG. 4 with a capacitance less than 0.03 ff.

A further concern is that parasitics added by the trimming switches 322-1 to 322-n might swamp the fine resolution of the switched capacitor. However, the switches and their parasitics are placed at the virtual ground of the operational amplifier. As a result, the parasitic are hidden for capacitors 220 and 230 Another concern is that parasitic loading can make the closed loop gain non-ideal. However, as shown in Equation (2) above, the parasitic capacitance Cin is reduced by the open loop gain Av1.

Figure 5:
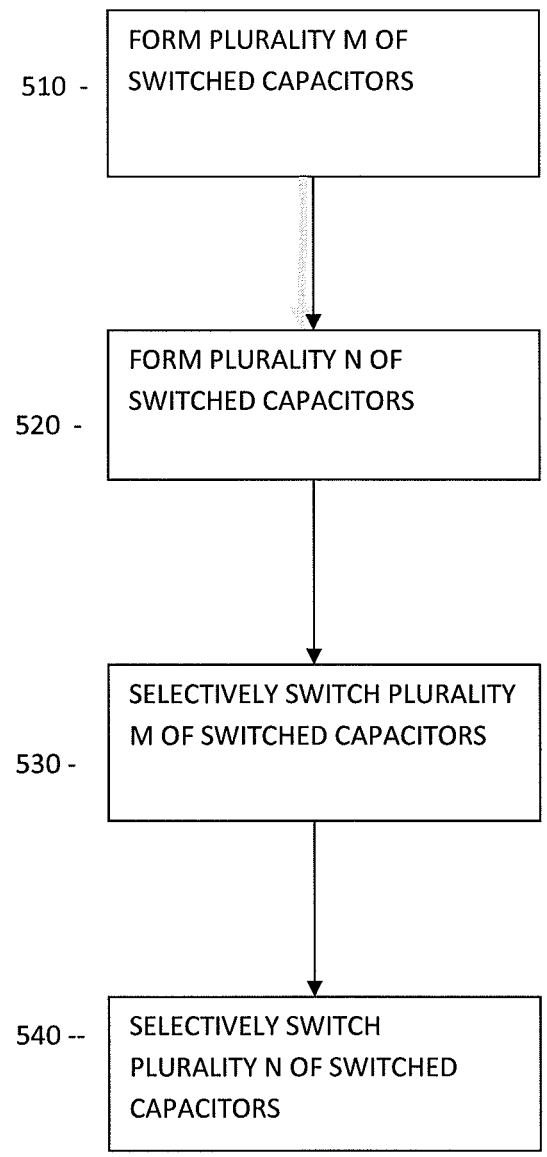
FIG. 5 is a flowchart depicting an illustrative method of practicing the invention.

FIG. 5 is a flowchart depicting a method for trimming capacitors such as might be used with an operational amplifier (op-amp). In step 510, a plurality M of switched capacitors is coupled between a first terminal and a second terminal of a first capacitor that is coupled between an input of the op-amp and an inverting input terminal of the op-amp. A first switched capacitor has a first capacitance C, a second switched capacitor has a second capacitance that is approximately C×2, a third switched capacitor has a third capacitance that is approximately $C \times 2^2$, and so on, with a Mth switched capacitor having a capacitance that is approximately $C \times 2^{(M-1)}$. As a result, the trimming capacitance coupled between the first and second terminals of the first capacitor can range between zero and the sum of the first through Mth capacitances in increments of the first capacitance.

In step 520, a plurality N of switched capacitors is coupled between a first terminal and a second terminal of a first capacitor that is coupled between an output of the op-amp and an inverting input terminal of the op-amp. A first switched capacitor has a first capacitance C, a second switched capacitor has a second capacitance that is approximately C×2, a third switched capacitor has a third capacitance that is approximately $C \times 2^2$, and so on, with a Nth switched capacitor having a capacitance that is approximately $C \times 2^{(N-1)}$. As a result, the trimming capacitance coupled between the first and second terminals of the second capacitor can range between zero and the sum of the first through Nth capacitances in increments of the first capacitance.

In step 530, the first capacitor is trimmed by selectively switching the switched capacitors of the plurality M of switched capacitors to provide a trimming capacitance between the first and second terminals of the first capacitor that can range between zero and the sum of the capacitances of the plurality M of switched capacitors in increments of the first capacitance; and in step 540 the second capacitor is trimmed by selectively switching the switched capacitors of the plurality of N switched capacitors to provide a trimming capacitance between the first and second terminals of the second capacitor that can range between zero and the sum of the capacitances of the plurality N of switched capacitances in increments of the first capacitance.

As will be apparent to those skilled in the art, numerous variations may be practiced within the spirit and scope of the present invention.

What is claimed is:

1. A circuit comprising:
   an operational amplifier (op-amp) having an inverting input, a non-inverting input, and an output;
   a first capacitor having a first terminal and a second terminal, the second terminal being coupled to the inverting input of the op-amp;
   a second capacitor having a first terminal and a second terminal, the first terminal being coupled to the output of the op-amp and the second terminal being coupled to the inverting input of the op-amp;
   a first trimming capacitor having a first terminal and a second terminal, the first terminal being coupled to the first terminal of the first capacitor and the second terminal of the first trimming capacitor being coupled to the second terminal of the first capacitor, said first trimming capacitor comprising a first plurality of switched capacitors, each switched capacitor having a different capacitance coupled in parallel between the first and second terminals of the first trimming capacitor;
   a second trimming capacitor having a first terminal and a second terminal, the first terminal being coupled to the first terminal of the second capacitor and the second terminal of the second trimming capacitor being coupled to the second terminal of the second capacitor, said second trimming capacitor comprising a second plurality of switched capacitors, each switched capacitor having a different capacitance coupled in parallel between the first and second terminals of the second trimming capacitor.

2. The circuit of claim 1 wherein the first plurality of switched capacitors comprises:
   a first switched capacitor and a first switch coupled in series with the first switched capacitor coupled to the first terminal of the first capacitor and the first switch coupled to the second terminal of the first capacitor; and
   a second switched capacitor and a second switch coupled in series with the second switched capacitor coupled to the first terminal of the first capacitor and the second switch coupled to the second terminal of the first capacitor.

3. The circuit of claim 2 wherein the second plurality of switched capacitors comprises:
   a third switched capacitor and a third switch coupled in series with the third switched capacitor coupled to the first terminal of the second capacitor and the third switch coupled to the second terminal of the second capacitor; and
   a fourth switched capacitor and a fourth switch coupled in series with the fourth switched capacitor coupled to the first terminal of the second capacitor and the fourth switch coupled to the second terminal of the second capacitor.

4. The circuit of claim 1 wherein the second plurality of switched capacitors comprises:
   a first switched capacitor and a first switch coupled in series with the first switched capacitor coupled to the first terminal of the second capacitor and the first switch coupled to the second terminal of the second capacitor; and
   a second switched capacitor and a second switch coupled in series with the second switched capacitor coupled to the first terminal of the second capacitor and the second switch coupled to the second terminal of the second capacitor.

5. The circuit of claim 1 wherein each of the switched capacitors comprises a switch capacitor and a switch coupled in series.

6. The circuit of claim 5 wherein the switch capacitor is coupled to the first terminal and the switch is coupled to the second terminal.

7. The circuit of claim 1 wherein there are at least three switch capacitors and a first switch capacitor has a capacitance of X, a second switch capacitor has a capacitance of 2X and a third switch capacitor has a capacitance of 4X.

8. The circuit of claim 7 wherein X is approximately 0.03 femtofarads.

9. A circuit comprising:
   a first capacitor having a first terminal and a second terminal, the second terminal being coupled to a virtual ground;
   a second capacitor having a first terminal and a second terminal, the second terminal being coupled to the virtual ground;
   a first trimming capacitor having a first terminal and a second terminal, the first terminal being coupled to the first terminal of the first capacitor and the second terminal of the first trimming capacitor being coupled to the second terminal of the first capacitor, said first trimming capacitor comprising a first plurality of switched capacitors, each switched capacitor having a different capacitance coupled in parallel between the first and second terminals of the first trimming capacitor;
   a second trimming capacitor having a first terminal and a second terminal, the first terminal being coupled to the first terminal of the second capacitor and the second terminal of the second trimming capacitor being coupled to the second terminal of the second capacitor, said second trimming capacitor comprising a second plurality of switched capacitors, each switched capacitor having a different capacitance coupled in parallel between the first and second terminals of the second trimming capacitor.

10. The circuit of claim 9 wherein the first plurality of switched capacitors comprises:
    a first switched capacitor and a first switch coupled in series with the first switched capacitor coupled to the first terminal of the first capacitor and the first switch coupled to the second terminal of the first capacitor; and
    a second switched capacitor and a second switch coupled in series with the second switched capacitor coupled to the first terminal of the first capacitor and the second switch coupled to the second terminal of the first capacitor.

11. The circuit of claim 10 wherein the second plurality of switched capacitors comprises:
    a third switched capacitor and a third switch coupled in series with the third switched capacitor coupled to the first terminal of the second capacitor and the third switch coupled to the second terminal of the second capacitor; and
    a fourth switched capacitor and a fourth switch coupled in series with the fourth switched capacitor coupled to the first terminal of the second capacitor and the fourth switch coupled to the second terminal of the second capacitor.

12. The circuit of claim 9 wherein the second plurality of switched capacitors comprises:
    a first switched capacitor and a first switch coupled in series with the first switched capacitor coupled to the first terminal of the second capacitor and the first switch coupled to the second terminal of the second capacitor; and
    a second switched capacitor and a second switch coupled in series with the second switched capacitor coupled to the first terminal of the second capacitor and the second switch coupled to the second terminal of the second capacitor.

13. The circuit of claim 9 wherein each of the switched capacitors comprises a switch capacitor and a switch coupled in series.

14. The circuit of claim 13 wherein the switch capacitor is coupled to the first terminal and the switch is coupled to the second terminal.

15. The circuit of claim 9 wherein there are at least three switch capacitors and a first switch capacitor has a capacitance of X, a second switch capacitor has a capacitance of 2X and a third switch capacitor has a capacitance of 4X.

16. The circuit of claim 15 wherein X is approximately 0.03 Femtofarads.

17. A method for trimming a first capacitor comprising:
    forming a plurality N of switched capacitors between a first terminal and a second terminal of the first capacitor, wherein a first switched capacitor has a first capacitance C, a second switched capacitor has a second capacitance that is approximately $C \times 2$, and so on, with a Nth switched capacitor having a capacitance that is approximately $C \times 2^{(N-1)}$, such that the trimming capacitance can range between zero and the sum of the first through Nth capacitances in increments of the first capacitance; and selectively switching the switched capacitors of the plurality of switched capacitors to provide a trimming capacitance between the first and second terminals of the first capacitor that can range between zero and a sum of the capacitances of the switched capacitors.

18. The method of claim 17 wherein the first capacitance is approximately 0.03 femtoFarads.

19. A method for trimming capacitors in an operational amplifier (op-amp) circuit comprising:

forming a plurality M of switched capacitors between a first terminal and a second terminal of a first capacitor coupled between an input of the op-amp circuit and an inverting input terminal of the op-amp circuit, wherein a first switched capacitor has a first capacitance C, a second switched capacitor has a second capacitance that is approximately C×2, and so on, with a Mth switched capacitor having a capacitance that is approximately $C \times 2^{(M-1)}$, such that the trimming capacitance can range between zero and the sum of the first through Mth capacitances in increments of the first capacitance; and forming a plurality N of switched capacitors between a first terminal and a second terminal of a second capacitor coupled between an output terminal of the op-amp circuit and the inverting input terminal of the op-amp circuit, wherein a first switched capacitor has a first capacitance that is approximately C, a second switched capacitor has a second capacitance that is approximately C×2, and so on, with a Nth switched capacitor having a capacitance that is approximately $C \times 2^{(N-1)}$, such that the trimming capacitance can range between zero and the sum of the first through Nth capacitances in increments of the first capacitance; and selectively switching the switched capacitors of the plurality M of switched capacitors to provide a trimming capacitance between the first and second terminals of the first capacitor that can range between zero and the sum of the capacitances of the plurality M of switched capacitors in increments of the first capacitance; and selectively switching the switched capacitors of the plurality N of switched capacitors to provide a trimming capacitance between the first and second terminals of the second capacitor that can range between zero and the sum of the capacitances of the plurality N of switched capacitances in increments of the first capacitance.

20. The method of claim 19 wherein the first capacitance is approximately 0.03 femtoFarads.

* * * * *